United States Patent
Urard et al.

(10) Patent No.: US 7,308,618 B2
(45) Date of Patent: Dec. 11, 2007

(54) INTERLEAVER AND DEVICE FOR DECODING DIGITAL SIGNALS COMPRISING SUCH AN INTERLEAVER

(75) Inventors: Pascal Urard, Theys (FR); Laurent Paumier, Grenoble (FR); Etiene Lantreibecq, Challes les Eaux (FR)

(73) Assignee: STMicroelectronics S.A., Montrouge (FR)

( * ) Notice: Subject to any disclaimer, the term of this patent is extended or adjusted under 35 U.S.C. 154(b) by 523 days.

(21) Appl. No.: 10/880,334

(22) Filed: Jun. 29, 2004

(65) Prior Publication Data

US 2005/0050428 A1 Mar. 3, 2005

(30) Foreign Application Priority Data

Jul. 4, 2003 (FR) .................................. 03 08238

(51) Int. Cl.
*G11C 29/00* (2006.01)
(52) U.S. Cl. .................................................. 714/702
(58) Field of Classification Search ......... 714/701–702
See application file for complete search history.

(56) References Cited

U.S. PATENT DOCUMENTS 6,138,262 A * 10/2000 Baek .......................... 714/768
6,151,690 A * 11/2000 Peeters ....................... 714/701
6,182,265 B1   1/2001 Lim
6,192,493 B1   2/2001 Combelles
6,748,560 B2 *  6/2004 Hatakeyama ............... 714/702
7,170,849 B1 *  1/2007 Arivoli et al. .............. 370/208

FOREIGN PATENT DOCUMENTS

EP   0 552 979   7/1993
EP   1 020 996   7/2000

OTHER PUBLICATIONS

Wu, et al., "Implementation of Low Complexity, Low Power, Integer-Based Turbo Decoder", Globcom '01, 2001 IEEE Gobal Telecommunications Conference, San Antonio, TX, Nov. 25-29, 2001, IEEE, New York, vol. 2 of 6, Nov. 25, 2001, pp. 946-951, XP001099245.
Preliminary French Search Report, FR 03 08238, dated Oct. 29, 2003.

* cited by examiner

*Primary Examiner*—Shelly Chase
(74) *Attorney, Agent, or Firm*—Gardere Wynne Sewell LLP

(57) ABSTRACT

An interleaver includes two random access memories for storing data and an addressing device (100) linked to respective address inputs of the two memories. The addressing device is designed to transmit, at each instant of a clock, a cue for read access to one of the two memories and a cue for write access to the other of the two memories, so that, at each instant, a data item is written to or read from each memory.

21 Claims, 2 Drawing Sheets

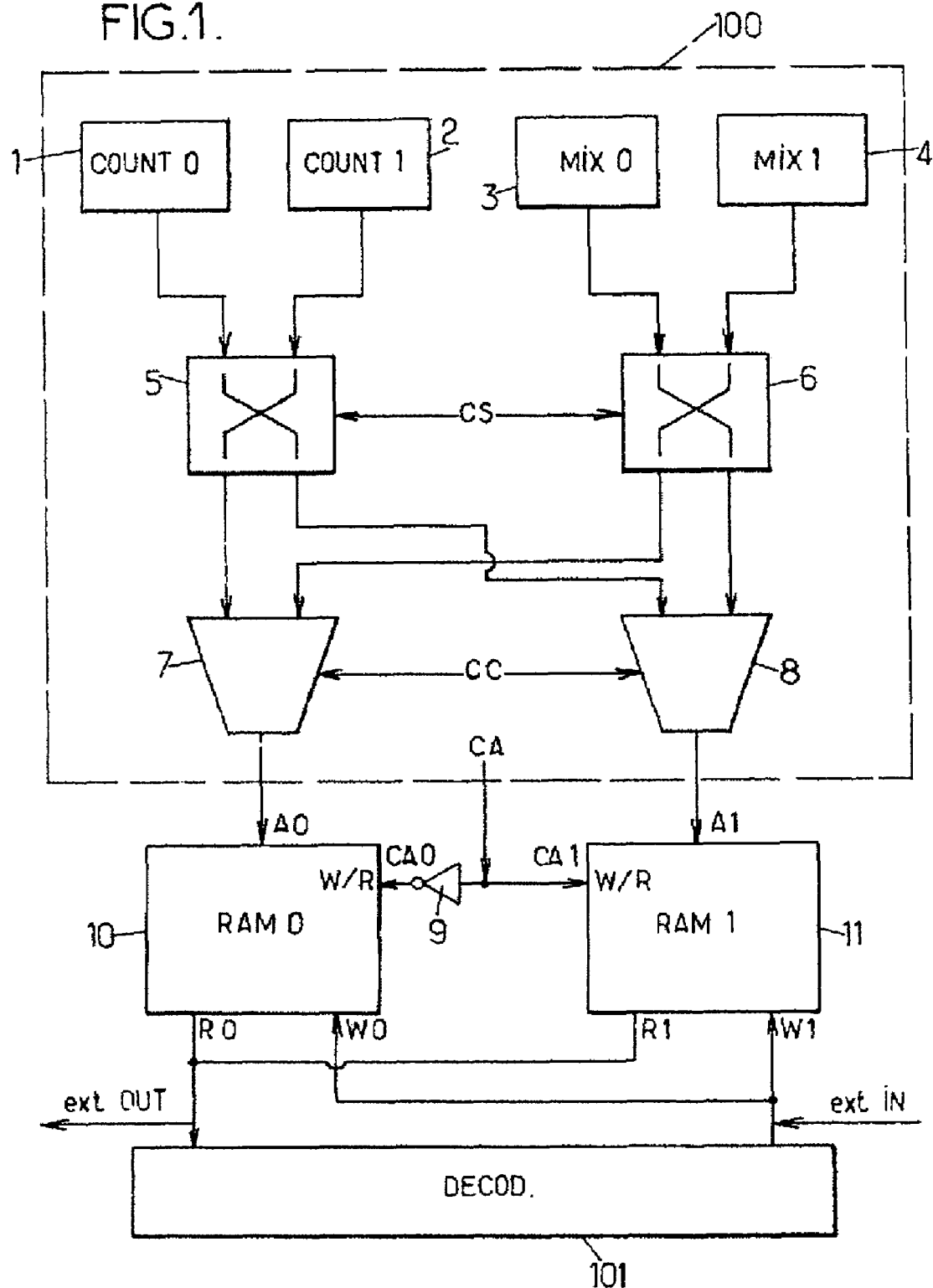

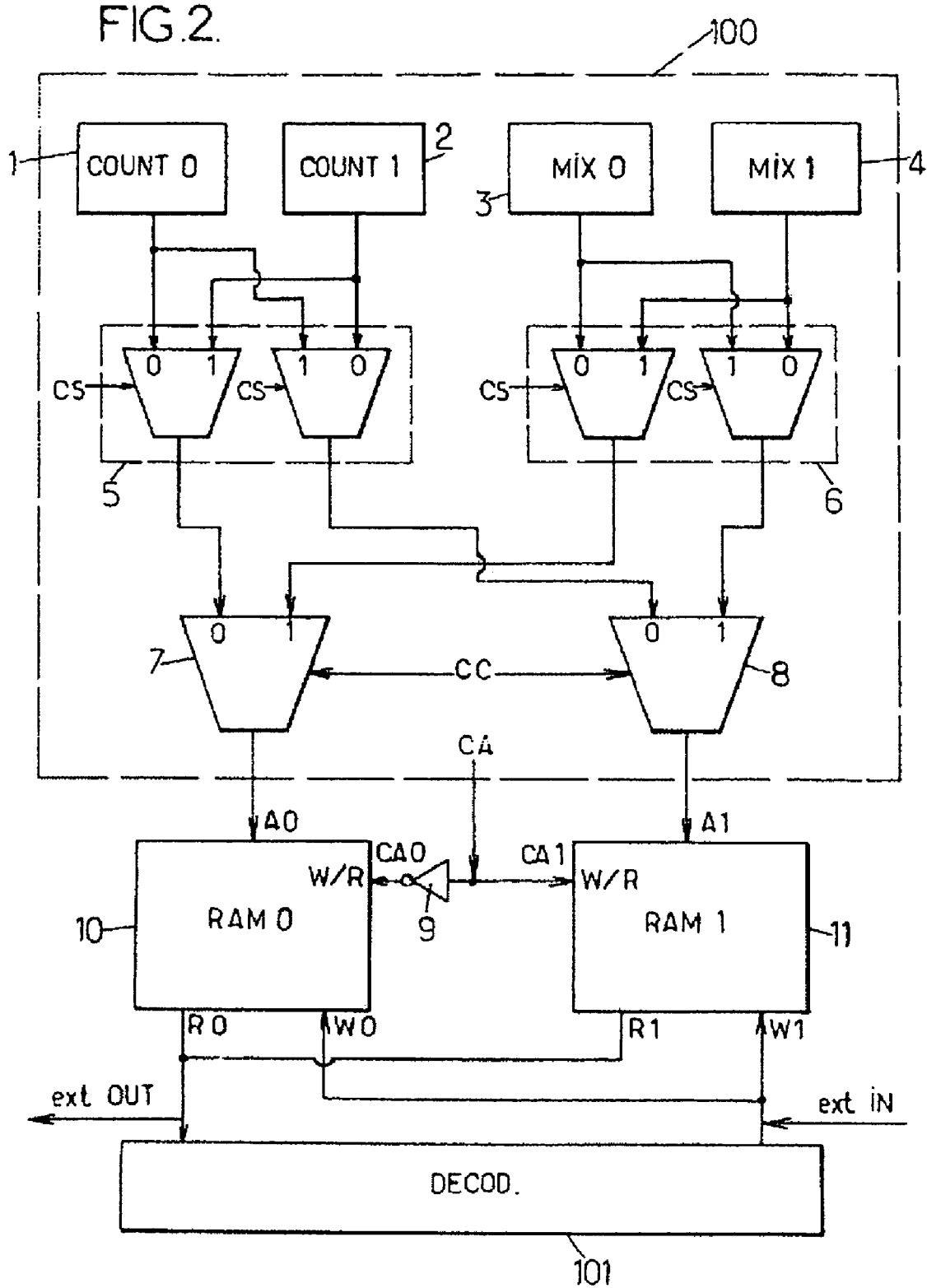

INTERLEAVER AND DEVICE FOR DECODING DIGITAL SIGNALS COMPRISING SUCH AN INTERLEAVER

PRIORITY CLAIM

The present application claims priority from French Application for Patent No. 03 08238 filed Jul. 4, 2003, the disclosure of which is hereby incorporated by reference.

BACKGROUND OF THE INVENTION

1. Technical Field of the Invention

The present invention relates an interleaver, useable in particular for the decoding of digital signals.

2. Description of Related Art

An interleaver is a unit for processing a digital data stream which changes the order of the data in the stream. Such an operation is useful, in particular, during transmission of a data stream: instead of irremediably affecting a small part of the data stream, any transmission errors are distributed over a large part of the stream, and are then able to be corrected using one of the correction methods known to the person skilled in the art. In general, transmission error correction combined with an interleaving operation is all the more effective as the order of the data in the stream may be regarded as random.

The data may be organized in the stream as successive data units, such as, for example, datagrams in the case of an IP transmission, cells in the case of an ATM transmission or frames in the case of a UMTS transmission.

To perform an interleaving of the data of the stream, the stream is chopped into stream slices of determined length. A stream slice generally comprises a large number of data units. The successive data of a slice are written to a random access memory according to a first determined ranking of the addresses of this memory, and are then read according to a second determined ranking of the addresses which differs from the first ranking. A change of order of the data in the stream, or interleaving, is thus obtained, which corresponds to the difference between the ranking of the addresses in respect of the writing of the data to the memory and the ranking of the addresses in respect of the reading of the data from the memory.

An interleaving of the data of the stream in the inverse order is obtained by exchanging the first and second rankings of the addresses between the memory read and write operations.

In a known manner, a working cycle of an interleaver comprises the following four phases, repeated for successive cycles:

1 writing of the successive data of a first stream slice to the memory, traversing the addresses of the memory according to a first ranking of said addresses;
2 reading of the data of the first stream slice from the memory, traversing the addresses of the memory according to a second ranking of said addresses;
3 writing of the successive data of a second stream slice to the memory, traversing the addresses of the memory according to the second ranking;
4 reading of the data of the second stream slice from the memory, traversing the addresses of the memory according to the first ranking.

Commonly, the first ranking of the addresses of the memory is the ascending numerical order of these addresses. The second ranking then corresponds to the order of interleaving. An interleaving operation consequently comprises a writing of the data according to the numerical order of the memory addresses, and a reading according to the interleaved order. Conversely, a deinterleaving operation comprises a writing of the data to the memory according to the interleaved order of the addresses, followed by a reading in the ascending numerical order of the addresses. During the working cycle of an interleaver described above, the first stream slice is interleaved, and the second stream slice is deinterleaved.

An advantage of this manner of working of the interleaver resides in the fact that the second and third phases of the cycle are performed simultaneously, as are the fourth and first phases of the cycle. A considerable interleaving/deinterleaving throughput is thus obtained. At each instant of a clock for regulating the interleaver, first data are therefore read from the memory and, simultaneously, second data are written to the memory. A dual port random access memory or DPRAM is commonly used for this purpose, so as to allow the two simultaneous operations of reading and writing. The capacity of the DPRAM memory is at least equal to the length of a stream slice.

A drawback of the use of a DPRAM memory resides in the considerable physical dimensions of the electronic component which constitutes this memory. This gives rise in particular to a high price of the memory component and bulkiness caused by this component within the interleaver.

There is accordingly a need to diminish the aforesaid drawbacks.

SUMMARY OF THE INVENTION

An embodiment of the invention proposes an interleaver comprising a first and a second random access memories for storing data and an addressing device linked to respective address inputs of the two memories. The addressing device being designed to transmit, at each instant of a clock linked to the addressing device, a cue for read access to one of the two memories and a cue for write access to the other of the two memories, so that, at each instant, a data item is written to or read from each memory. Furthermore, the addressing device is designed to transmit, at each instant, a first address of a first sequence of addresses to the first memory and a second address of a second sequence of addresses to the second memory. The sequence of addresses intended for each memory is constructed from two different successively traversed rankings of the addresses of said memory, each ranking being traversed in combination with a read access cue then in combination with a write access cue before being followed by the other ranking in said sequence of addresses.

Thus, an interleaver according to the invention uses two random access memories simultaneously, at each instant, to write data of a stream slice to and respectively read data of a stream slice from each of the two memories. Each memory of the interleaver can then be of the single port memory type or SPRAM (standing for "Single Port Random Access Memory").

Moreover, each memory of the interleaver can have a capacity limited to half the length of the stream slices.

By replacing a DPRAM-type memory having a determined capacity by two SPRAM-type memories each having a capacity equal to half said determined capacity it is possible to reduce the dimensions of the interleaver, and to decrease its price, while allowing identical processing of the data streams.

According to the preferred embodiment of the invention, the addressing device is designed to transmit opposite access cues to each memory between two successive instants. Such an addressing device can be particularly simple, in particular the part of this device that is dedicated to the generation of the access cues. Furthermore, an interleaver thus constructed can carry out an interleaving that mixes the data of each stream slice over the entire length of this slice. In the jargon of the person skilled in the art, such an interleaver is said to possess an interleaving depth equal to the length of the stream slices. Maximum effectiveness of correction of transmission errors is then obtained.

Preferably, a first of the two rankings of the addresses is the ascending numerical order of the addresses, or incremental order. The second ranking of the addresses may be obtained either by calculation, or by reading a stored table. The addressing device can therefore comprise a generator by calculation of the addresses according to the second ranking. Alternatively, the addressing device can comprise a generator of the addresses according to the second ranking which produces a first part of the addresses in accordance with a stored table, and a second part of the addresses by calculation using the stored table. A more random interleaving can be obtained by using a stored table as compared with the case of a second ranking obtained solely by calculation. Moreover, by virtue of the recourse to a calculation for the second part of the addresses, the mixed mode of obtaining the addresses according to the second ranking requires only a limited volume of permanent memory (or ROM memory standing for "Read Only Memory").

The invention also relates to a device for decoding digital signals comprising an interleaver as described above, and a decoder linked to an input for writing data and to an output for reading data of each memory of the interleaver.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a schematic diagram of an interleaver according to the invention; and

FIG. 2 corresponds to FIG. 1 in respect of a particular embodiment of the interleaver.

DETAILED DESCRIPTION OF THE DRAWINGS

In accordance with FIG. 1, an interleaver comprises an addressing device 100 connected to two dynamic random access memories, 10 and 11, denoted RAM0 and RAM1 respectively. At each instant of a clock (not represented) connected to the interleaver, the device 100 transmits a write address to one of the two memories 10 or 11, and a read address to the other of the two memories. A0 is the address transmitted to the memory 10, and A1 is the address transmitted to the memory 11. The mode of access to each memory 10 and 11 is fixed by a binary access cue CA produced by the device 100 at a dedicated access cue output. The access cue output is linked directly to the access cue input W/R of the memory 11 (denoted CA1 in FIG. 1), and is linked by an inverter 9 to the access cue input W/R of the memory 10 (denoted CA0).

First data buses link a data output of a decoder 101 (denoted DECOD) to respective data write inputs W0, W1 of the two memories 10, 11. Likewise, second read data buses link respective data outputs R0, R1 of each memory 10, 11 to a data input of the decoder 101. In a known manner, an external data input (denoted ext IN) is connected to the first buses for initially fetching the data intended to be decoded, and an external data output (denoted ext OUT) is connected to the second buses for recovering the decoded data.

Each memory 10, 11 can exhibit, for example, 3200 memory locations corresponding to distinct addresses. Each location can, for example, be dimensioned to receive three words of six bits each. Together, the three words constitute a data item stored at a memory location associated with a unique address for an interleaving or deinterleaving operation. A data stream slice interleaved or deinterleaved during a working cycle of the interleaver then groups together 6400 triplets of 6-bit words, each triplet constituting the elementary interleaving unit.

The addressing device 100 comprises two counters 1 and 2, denoted COUNT 0 and COUNT 1 in FIG. 1, which each cyclically produce an integer number lying between 0 and 3199, incremented by one unit every two successive instants regulated by the clock. The counter 2 produces each number with a delay determined with respect to the instant at which the counter 1 produces the same number. This delay is chosen greater than or equal to a latency time of the decoder 101, which may, by way of example, be 137 clock cycles. Each number corresponds to an address in the two memories 10 and 11.

The addressing device 100 also comprises two mixers 3 and 4, denoted MIX 0 and MIX 1. Each mixer 3, 4 cyclically produces an integer number varying between two successive instants regulated by the clock and corresponding to an address in each memory 10, 11. The two mixers 3 and 4 produce the numbers according to a common predetermined ranking, which is interleaved with respect to the incremental ranking of said numbers. The mixer 4 produces the same numbers as the mixer 3 with a delay identical to that of the counter 2 with respect to the counter 1.

A first exchanger 5 is input-linked to the counters 1 and 2, and is designed to exchange between two outputs of the exchanger 5 the numbers produced respectively by the counters 1 and 2 at one and the same instant. This exchange is effected as a function of a memory selection binary cue CS transmitted to the exchanger 5.

Likewise a second exchanger 6, identical to the exchanger 5, is input-linked to the mixers 3 and 4 and is designed to exchange between two outputs of the exchanger 6 the numbers produced respectively by the mixers 3 and 4 at one and the same instant, as a function of the memory selection cue CS.

In accordance with FIG. 2, each exchanger 5, 6 can be embodied by means of two binary selectors whose inputs are connected in parallel, and which are controlled respectively by the cue CS or by a cue corresponding to the inverse of the cue CS.

A first ranking selector 7 possesses two inputs linked respectively to first respective outputs of the exchangers 5 and 6, and an output linked to the address input of the memory 10. The selector 7 is designed to reproduce on its output the number transmitted to one of its inputs as a function of a binary ranking cue CC. The number produced by the output of the selector 7 corresponds to the address A0.

Likewise, a second ranking selector 8 possesses two inputs linked respectively to two second respective outputs of the exchangers 5 and 6, distinct from the first outputs of the exchangers 5 and 6, and possesses an output linked to the address input of the memory 11. The selector 8 is designed to reproduce on its output the number transmitted to one of its inputs as a function of the cue CC. The number produced by the output of the selector 8 corresponds to the address A1.

The inputs of the exchangers 5 and 6 and of the selectors 7 and 8 are connected in such a way that the cue CS instructs a delayed transmission of addresses so as to take account of the latency time of the decoder 101 to one of the two memories 10, 11, and a non delayed transmission of addresses to the other of the two memories 10, 11. According to FIG. 2, when the cue CS is equal to 0, the exchanger 5 transmits the number produced by the counter 1 to the selector 7 and the number produced by the counter 2 to the selector 8. The exchanger 6 then transmits the number produced by the mixer 3 to the selector 7 and the number produced by the mixer 4 to the selector 8. Conversely, when the cue CS is equal to 1, the exchanger 5 transmits the number produced by the counter 2 to the selector 7 and the number produced by the counter 1 to the selector 8. The exchanger 6 then transmits the number produced by the mixer 4 to the selector 7 and the number produced by the mixer 3 to the selector 8.

The inputs of the selectors 7 and 8 are connected in such a way that the addresses A0 and A1 are simultaneously transmitted to the two memories 10 and 11, respectively, according to one and the same ranking, that is to say either according to the incremental ranking, or according to the interleaved ranking. For example, when the cue CC is equal to 0, the selectors 7 and 8 transmit the numbers emanating from the exchanger 5 and originating from the counters 1 and 2 to the memories 10 and 11 respectively. When the cue CC is equal to 1, the selectors 7 and 8 transmit the numbers emanating from the exchanger 6, originating from the mixers 3 and 4, to the memories 10 and 11 respectively.

The cue CC is inverted each time that all the addresses of the memories 10 and 11 have been produced, each address having been associated with a read followed by a write access cue, either according to the incremental ranking by the two counters 1 and 2, or according to the interleaved ranking by the mixers 3 and 4.

The access cue CA and the selection cue CS are chosen to be identical to one another at each instant. The intervention of each counter 1, 2 or mixer 3, 4 in the course of a working cycle of the interleaver is then distributed in the following manner:

the counter 1 produces the addresses for the deinterleaving reading phase;
the counter 2 produces the addresses for the interleaving writing phase;
the mixer 1 produces the addresses for the interleaving reading phase; and
the mixer 2 produces the addresses for the deinterleaving writing phase.

Equivalently, the access cue CA can be chosen to be inverse to the selection cue CS if, conversely to FIGS. 1 and 2, the access cue CA output is linked directly to the access cue input of the memory 10, and is linked by an inverter to the access cue input of the memory 11.

Furthermore, the addressing device 100 is designed to produce cues CA and CS each inverted between two successive instants. A data read from one of the memories 10 or 11 at a given instant is therefore followed by a data write to the same memory at the next instant, and vice versa.

It emerges from the above mode of working that each data item of the stream to be decoded is written to and then read from one or the other of the two memories 10 or 11 as a function of the parity of its position of appearance in the frame to which it belongs. Thus, the data of even position within a frame are written to and then read from the memory 10, and the data of odd position within a frame are written to and then read from the memory 11.

The mixers 3 and 4 can use a recording of the addresses according to the interleaved ranking in a ROM memory. They can also implement an algorithm for generating the addresses according to the interleaved ranking, or else use a method which combines a recording of the addresses and a generating algorithm.

The counters 1 and 2 may be mutually identical, as may the mixers 3 and 4. Alternatively, the counter 2 and the mixer 4 may consist of respective memories of queue type (or FIFO standing for "First In-First Out"), whose inputs are connected respectively to the outputs of the counter 1 and of the mixer 3. The capacity of these memories corresponds to the delays of the counter 2 and of the mixer 4 respectively with respect to the counter 1 and to the mixer 3.

To illustrate the compactness procured by the invention, the inventors give the following exemplary embodiment. A commercial single port random access memory (SPRAM) with a capacity of 3200 triplets of words of 6 bits each possesses a length of 595.1 micrometers ($\mu$m) and a length of 439.2 $\mu$m, i.e. an area of 0.26 square millimeters ($mm^2$). Moreover, a commercial dual port random access memory (DPRAM), of identical technology to that of the above single port memories, and having a capacity of 6400 triplets of words of 6 bits each possesses a length of 1034.3 $\mu$m and a width of 963.1 $\mu$m. Its area is therefore 0.99 $mm^2$. Consequently, for identical interleaving capacity, the replacement according to the invention of a DPRAM memory of 6400 triplets of 6 bits by two SPRAM memories of 3200 triplets of 6 bits corresponds to a saving of 47% in terms of interleaver electronic circuit area dedicated to the data storage function.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An interleaver, comprising:
a first and a second random access memories for storing data;
an addressing device linked to respective address inputs of the first and second memories, the addressing device transmitting, at each instant of a clock linked to the addressing device, a cue for read access to one of the two memories and a cue for write access to the other of the two memories, so that, at each instant, a data item is written to or read from each memory, the addressing device furthermore transmitting, at each instant, a first address of a first sequence of addresses to the first memory and a second address of a second sequence of addresses to the second memory, the addressing device constructing the first and second sequence of addresses transmitted to each memory from a single successively traversed ranking of the addresses of said memories which is selected from two different rankings of addresses that are interleaved with respect to each other, each of the two different rankings being traversed in combination with a read access cue and a write access cue before the other ranking is traversed.

2. The interleaver according to claim 1, wherein the addressing device transmits opposite access cues to each memory between two successive instants.

3. The interleaver according to claim 2, wherein a first of the two rankings of the addresses is in ascending numerical order, and wherein the addressing device comprises a generator for calculating the addresses according to the second of the two rankings.

4. The interleaver according to claim 2, wherein a first of the two rankings of the addresses is in ascending numerical order, and wherein the addressing device comprises a generator of the addresses according to the second of the two rankings, said generator producing a first part of the addresses in accordance with a stored table, and a second part of the addresses by calculation using the stored table.

5. The interleaver according claim 1, wherein the addressing device comprises:
   a first and a second counters each producing cyclically an integer number incremented by one unit every two successive instants and corresponding to an address in each memory,
   a first and a second mixer each producing cyclically an integer number varying between two successive instants according to a common ranking interleaved with respect to the incremental ranking of said numbers, said numbers corresponding to an address in each memory,
   a first exchanger linked to the first and second counters and designed to exchange between two outputs of the first exchanger the numbers produced respectively by the two counters at one and the same instant as a function of a memory selection binary cue transmitted to the first exchanger;
   a second exchanger linked to the first and second mixers and designed to exchange between two outputs of the second exchanger the numbers produced respectively by the two mixers at one and the same instant as a function of the memory selection cue transmitted to the second exchanger;
   a first ranking selector having two inputs linked respectively to a first output of the first exchanger and to a first output of the second exchanger, and furthermore having an output linked to the address input of the first memory, the first selector being designed to reproduce on said output the number transmitted to one of the inputs of the first selector as a function of a ranking binary cue transmitted to the first selector;
   a second ranking selector having two inputs linked respectively to a second output of the first exchanger and to a second output of the second exchanger, and furthermore having an output linked to the address input of the second memory, the second selector being designed to reproduce on said output the number transmitted to one of the inputs of the second selector as a function of the ranking cue transmitted to the second selector;
   an access cue output linked to an access cue input of each memory, respectively by a direct link and by an inverter, the interleaver being designed so that the access cue is identical or opposite at each instant to the selection cue.

6. A device for decoding digital signals, comprising:
   an interleaver comprising:
      a first and a second random access memories for storing data; and
      an addressing device linked to respective address inputs of the first and second memories, the addressing device transmitting, at each instant of a clock linked to the addressing device, a cue for read access to one of the two memories and a cue for write access to the other of the two memories, so that, at each instant, a data item is written to or read from each memory, the addressing device furthermore transmitting, at each instant, a first address of a first sequence of addresses to the first memory and a second address of a second sequence of addresses to the second memory, the addressing device constructing the first and second sequence of addresses transmitted to each memory from a single successively traversed ranking of the addresses of said memories which is selected from two different rankings of addresses that are interleaved with respect to each other, each of the two different rankings being traversed in combination with a read access cue and a write access cue before the other ranking is traversed; and
   a decoder linked to an input for writing data and to an output for reading data of each memory of the interleaver.

7. An interleaver, comprising:
   a first random access memory having a first addressing input;
   a second random access memory having a second addressing input;
   an address generator coupled to the first and second random access memories, the address generator generating a first ranking of addresses in incremental order and a second ranking of addresses in interleaved order and selectively applying addresses from the first/second rankings of addresses to the first/second addressing inputs such that, during a first time period. all addresses from the first ranking are sequentially applied to both the first and second random access memories and then, during a next second time period, all addresses from the second ranking are sequentially applied to both the first and second random access memories.

8. The interleaver of claim 7 wherein the first and second random access memories are single port random access memories.

9. The interleaver of claim 7 further including:
   a control signal for application to the first/second random access memories to cause, for one individual address in a ranking that is applied, one of the first/second random access memories to be set in read mode and the other one of the first/second random access memories to be set in write mode, and then for a next individual address in the ranking that is applied, the other one of the first/second random access memories to be set in read mode and the one of the first/second random access memories to be set in write mode.

10. A method for interleaving a stream of data using a first and a second memory, comprising:
   generating a first ranking of addresses in incremental order;
   generating a second ranking of addresses in interleaved order;
   selectively applying the first/second rankings of addresses to the first/second memories such that, during a first time period, all addresses from the first ranking are sequentially applied to both the first and second random access memories and then, during a next second time period, all addresses from the second ranking is sequentially applied to both the first and second random access memories; and
   writing the stream of data to and reading the stream of data from the first and second memory at the selectively applied addresses.

11. The method of claim 10 further comprising causing, for one individual address in a ranking that is applied, one of the first/second random access memories to be set in read mode and the other one of the first/second random access memories to be set in write mode, and then for a next individual address in the ranking that is applied, the other one of the first/second random access memories to be set in read mode and the one of the first/second random access memories to be set in write mode.

12. The method of claim 10 wherein the stream of data consists of an alternating sequence of even and odd data units, and wherein even data units in the stream are written to/read from one of the first/second memories and odd data units in the stream are written to/read from the other of the first/second memories.

13. The method of claim 10 wherein the first and second memories are both single port random access memories.

14. The method of claim 10 wherein selectively applying comprises applying an address from the ranking to one of the first/second random access memories and a delayed address from the ranking to the other of the first/second random access memories.

15. The method of claim 14 wherein a time delay between the address and the delayed address is about equal to a latency time of a decoder which processes the stream of data.

16. An interleaver, comprising:
a first random access memory having a first addressing input;
a second random access memory having a second addressing input; and
an address generator coupled to the first and second random access memories, the address generator generating a first address for application to the first addressing input for specifying one of a read/write address and a second address for application to the second addressing input for specifying the other of the read/write address, both of the first and second generated addresses being selected from one of a first ranking of addresses arranged in incremental order and a second ranking of addresses arranged in interleaved order.

17. The interleaver of claim 16 wherein the first address from one of the first/second rankings of addresses and the second address from the same one of the first/second rankings of addresses are delayed with respect to each other.

18. The interleaver of claim 17 wherein the interleaver is coupled to a decoder and a time delay between the first and second addresses is about equal to a latency time of the decoder.

19. The interleaver of claim 16 wherein the address generator applies the first/second addresses such that all addresses from one of the first/second rankings of addresses are sequentially applied to the first/second addressing inputs during a first time period and then all addresses from the other of the first/second rankings of addresses are sequentially applied to the first/second addressing inputs during a next second time period.

20. The interleaver of claim 16 further including:
a control signal for application to the first/second random access memories to cause, for an application of a given first and second address, one of the first/second random access memories to be set in read mode and the other one of the first/second random access memories to be set in write mode, the setting of the memories in read/write mode alternating with each address application.

21. The interleaver of claim 16 wherein the interleaver processes a stream of data consisting of an alternating sequence of even and odd data units, and wherein the address generator controls first/second memory operation to cause even data units in the stream to be written to/read from one of the first/second memories and odd data units in the stream to be written to/read from the other of the first/second memories.

* * * * *

UNITED STATES PATENT AND TRADEMARK OFFICE
CERTIFICATE OF CORRECTION

| | | |
|---|---|---|
| PATENT NO. | : 7,308,618 B2 | Page 1 of 1 |
| APPLICATION NO. | : 10/880334 | |
| DATED | : December 11, 2007 | |
| INVENTOR(S) | : Pascal Urard et al. | |

It is certified that error appears in the above-identified patent and that said Letters Patent is hereby corrected as shown below:

In the Claims:

At column 8, claim number 7, line number 28, please replace the phrase [during a first time period. all addresses] with the following phrase -- during a first time period, all addresses --.

Signed and Sealed this
Thirteenth Day of September, 2011

David J. Kappos
*Director of the United States Patent and Trademark Office*